US009865310B2

United States Patent
Cantle et al.

(10) Patent No.: US 9,865,310 B2
(45) Date of Patent: Jan. 9, 2018

(54) HIGH DENSITY MEMORY MODULES

(75) Inventors: Allan Cantle, Westlake Village, CA (US); Patrick Weber, Oxnard, CA (US); Mark Gilliam, Thousand Oaks, CA (US); Prashant Joshi, Thousand Oaks, CA (US)

(73) Assignee: INTERCONNECT SYSTEMS, INC., Camarillo, CA (US)

( * ) Notice: Subject to any disclaimer, the term of this patent is extended or adjusted under 35 U.S.C. 154(b) by 598 days.

(21) Appl. No.: 13/404,995

(22) Filed: Feb. 24, 2012

(65) Prior Publication Data
US 2013/0058148 A1 Mar. 7, 2013

Related U.S. Application Data

(60) Provisional application No. 61/446,168, filed on Feb. 24, 2011.

(51) Int. Cl.
*H05K 1/11* (2006.01)
*H05K 1/14* (2006.01)
(Continued)

(52) U.S. Cl.
CPC ............... *G11C 5/04* (2013.01); *H05K 1/141* (2013.01); *H05K 1/144* (2013.01);
(Continued)

(58) Field of Classification Search
CPC . H01L 25/03; H01L 25/0857; H01L 25/0657; H05K 1/144; H05K 1/141; H05K 3/306
(Continued)

(56) References Cited

U.S. PATENT DOCUMENTS 5,036,431 A * 7/1991 Adachi et al. ................ 361/803
5,994,166 A * 11/1999 Akram ................... H05K 1/144
257/686

(Continued)

OTHER PUBLICATIONS

Data Sheet, dated Jun. 2008—STTS424E02 Memory Module Temperature Sensor With a 2 Kb SPD EEPROM (pp. 1-51) for STMicroelectronics [retrieved on Oct. 12, 2012]. [online]. Retrieved on the Internet at: URL:http://www.alldatasheet.com/datasheet-pdf/pdf/227451/STMICROELECTRONICS/STTS . . . .

(Continued)

*Primary Examiner* — Tuan T Dinh
(74) *Attorney, Agent, or Firm* — Koppel, Patrick, Heybl & Philpott

(57) ABSTRACT

Solid state memory modules are disclosed having increased density for module size/footprint. Different embodiments also provide for improved interconnect arrangements between the memory modules and the corresponding field programmable gate array (FPGA), micro-processor (μP), or application-specific integrated circuit (ASIC). These interconnects provide for greater module interconnect flexibility, operating speed and operating efficiency. Some memory module embodiments according to the present invention comprises a plurality of solid state memory devices arranged on a first printed circuit board. A second printed circuit board is on and electrically connected to the first printed circuit board, with the second printed circuit board having a pin-out for direct coupling to a host device.

7 Claims, 6 Drawing Sheets

(51) Int. Cl.
*G11C 5/04* (2006.01)
*H05K 3/34* (2006.01)
*H01L 25/065* (2006.01)

(52) U.S. Cl.
CPC ...... *H01L 25/0652* (2013.01); *H01L 25/0655* (2013.01); *H01L 2924/0002* (2013.01); *H05K 3/3436* (2013.01); *H05K 2201/042* (2013.01); *H05K 2201/10159* (2013.01); *H05K 2201/2036* (2013.01)

(58) Field of Classification Search
USPC ................. 361/760–790, 803; 257/780–790
See application file for complete search history.

(56) References Cited

U.S. PATENT DOCUMENTS

| | | | | |
|---|---|---|---|---|
| 6,049,467 | A * | 4/2000 | Tamarkin | H01L 25/105 174/535 |
| 6,297,960 | B1 * | 10/2001 | Moden et al. | 361/719 |
| 6,359,790 | B1 * | 3/2002 | Meyer-Berg | 361/803 |
| 6,472,735 | B2 * | 10/2002 | Isaak | H01L 25/0657 257/685 |
| 6,493,240 | B2 * | 12/2002 | Broglia | H05K 1/141 361/736 |
| 6,781,241 | B2 * | 8/2004 | Nishimura | H01L 25/03 257/686 |
| 6,861,278 | B2 * | 3/2005 | Quinones et al. | 438/51 |
| 7,102,905 | B2 * | 9/2006 | Funaba | G11O 5/04 257/686 |
| 7,184,276 | B2 * | 2/2007 | Hashimoto | 361/803 |
| 7,217,993 | B2 * | 5/2007 | Nishimura | H01L 25/105 257/685 |
| 7,550,836 | B2 * | 6/2009 | Chou et al. | 257/686 |
| 7,829,992 | B2 * | 11/2010 | Sugino | H01L 23/16 257/686 |
| 8,208,270 | B2 * | 6/2012 | Mori | B23K 1/0016 361/770 |
| 8,476,775 | B2 * | 7/2013 | Yang | H01L 21/4832 257/686 |
| 8,609,463 | B2 * | 12/2013 | Ko | H01L 23/552 257/686 |
| 8,796,835 | B2 * | 8/2014 | Kim | H01L 23/367 257/686 |
| 9,167,686 | B2 * | 10/2015 | Chen | H01L 23/3121 |
| 2004/0104469 | A1 * | 6/2004 | Yagi | G06K 19/07 257/723 |
| 2004/0195667 | A1 * | 10/2004 | Karnezos | H01L 23/3135 257/686 |
| 2006/0284299 | A1 * | 12/2006 | Karnezos | H01L 23/3128 257/686 |
| 2009/0067143 | A1 * | 3/2009 | Lee et al. | 361/764 |

OTHER PUBLICATIONS

Data Sheet, dated Feb. 2008 Sink/Source DDR Termination Regulator TPS51200 (pp. 1-35) for Texas Instruments [retrieved on Oct. 12, 2012]. [online]. Retrieved on the Internet at: URL:http://www.ti.com/product/tps51200.

Data Sheet, dated Mar. 2008—Revised Oct. 2008, SN74SSQE32882 28-Bit to 56-Bit Registered Buffer With Address Parity Test One Pair to Four Pair Differential Clock PLL Driver (pp. 1-7) for Texas Instruments [retrieved on Oct. 12, 2012]. [online]. Retrieved on the Internet at: URL:http://www.ti.com/product/sn74ssqe32882.

* cited by examiner

FIG. 9
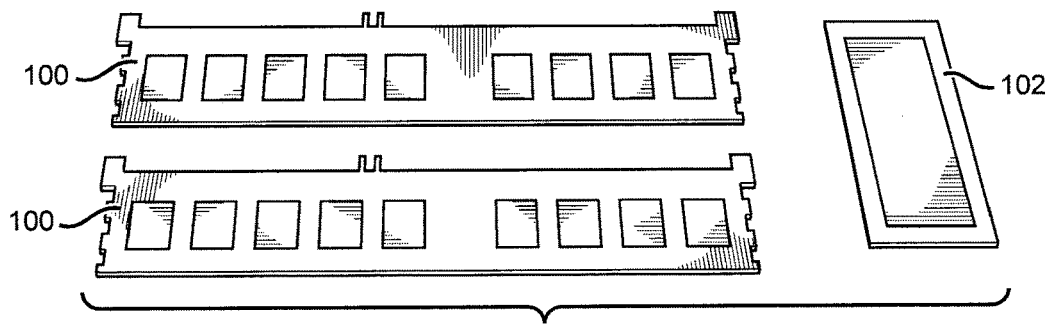
FIG. 10
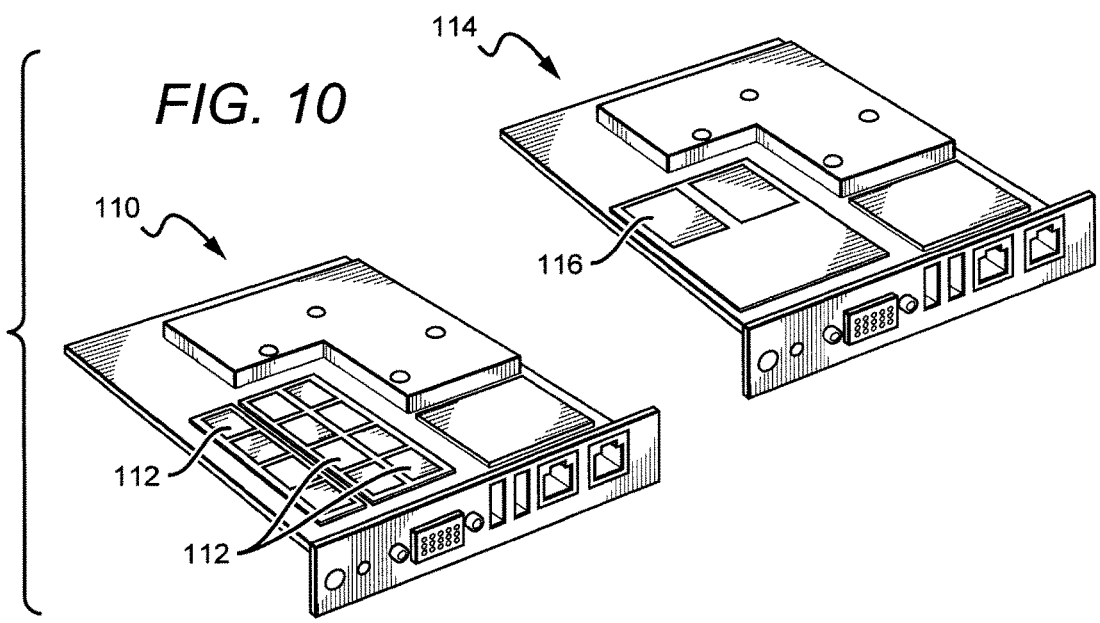
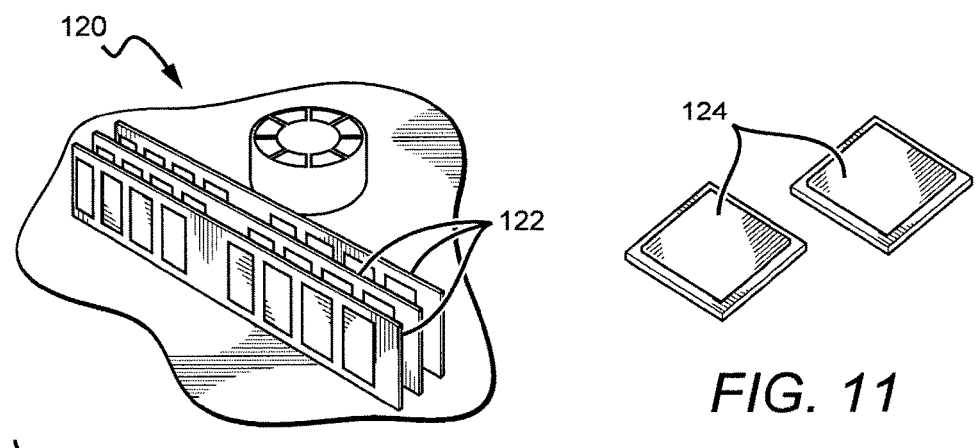
FIG. 11

HIGH DENSITY MEMORY MODULES

This application claims the benefit of U.S. Provisional Patent Application Ser. No. 61/446,168, filed on Feb. 24, 2011.

BACKGROUND OF THE INVENTION

Field of the Invention

This invention relates to memory modules, and more particularly to high density semiconductor memory modules.

Description of the Related Art

Present-day computing systems often utilize standardized memory modules to add memory capacity to a system. A memory module is generally comprised of a number of memory chips mounted on a printed circuit card adapted for insertion into a standard carrier or socket connector. Some of these modules can be easily added or removed from a system to permit flexible configuration of memory capacity. The module and socket adhere to a standardized pin assignment for exchange of signals between a system bus and the memory chips. Signals are routed from the carrier connector to the memory chips in accordance with the particular standard used for the module and the particular memory chips selected by the memory module manufacturer.

Standard memory modules are known as single in-line memory modules (SIMM or SIMMs) and dual in-line memory modules (DIMM or DIMMs). Each of these can comprise a series of dynamic random-access memory integrated circuits. These modules are mounted on a printed circuit board and designed for use in personal computers, workstations and servers. The main difference between SIMMs and DIMMs is that DIMMs have separate electrical contacts on each side of the module, while the contacts on SIMMs on both sides are redundant. Another difference is that standard SIMMs have a 32-bit data path, while standard DIMMs have a 64-bit data path. DIMMs began to replace SIMMs as the predominant type of memory module newer processors began to gain market share.

SUMMARY OF THE INVENTION

The size of many devices utilizing these memory modules has reduced over time. There remains a need to also reduce the size of the memory modules used with these devices. The present invention is directed to memory modules having increased density for module size/footprint, while also providing for improved interconnect arrangements between the memory modules and the corresponding field programmable gate array (FPGA), micro-processor (μP), or application-specific integrated circuit (ASIC). These interconnects can provide for greater module interconnect flexibility, operating speed and operating efficiency.

One embodiment of a memory module according to the present invention comprises a plurality of solid state memory devices arranged on a first printed circuit board. A second printed circuit board is on and electrically connected to the first printed circuit board, with the second printed circuit board having a pin-out for direct coupling to a host device.

An electronic system according to the present invention comprises a motherboard with one or more memory modules mounted to a first surface of the mother board. A host device is mounted to a second surface of the motherboard, with the one or more memory modules coupled to the host device through the motherboard.

Another embodiment of a memory module according to the present invention comprises a plurality of stacked printed circuit boards, at least one of which has a solid state memory device. The printed circuit boards are in electrical connection and a pin-out is included on an exposed surface of one of the printed circuit boards, the pin-out is arranged for direct connection to a host device. The pin-out is also in electrical connection with the memory device.

These and other aspects and advantages of the invention will become apparent from the following detailed description and the accompanying drawings which illustrate by way of example the features of the invention.

BRIEF DESCRIPTION OF THE DRAWINGS

FIG. 4b is a bottom perspective view of the memory module shown in FIG. 4a;

FIG. 4c is a top view of the memory module shown in FIG. 4a;

FIG. 4d is a side view of the memory module shown in FIG. 4a;

FIG. 4e is a sectional view of the memory module shown in FIG. 4a;

FIG. 9 also shows a comparison of conventional memory modules and modules according to the present invention;

FIG. 10 shows another comparison of conventional memory modules and modules according to the present invention; and FIG. 11 shows still another comparison of conventional memory modules and modules according to the present invention.

DETAILED DESCRIPTION OF THE INVENTION

Figure 1:
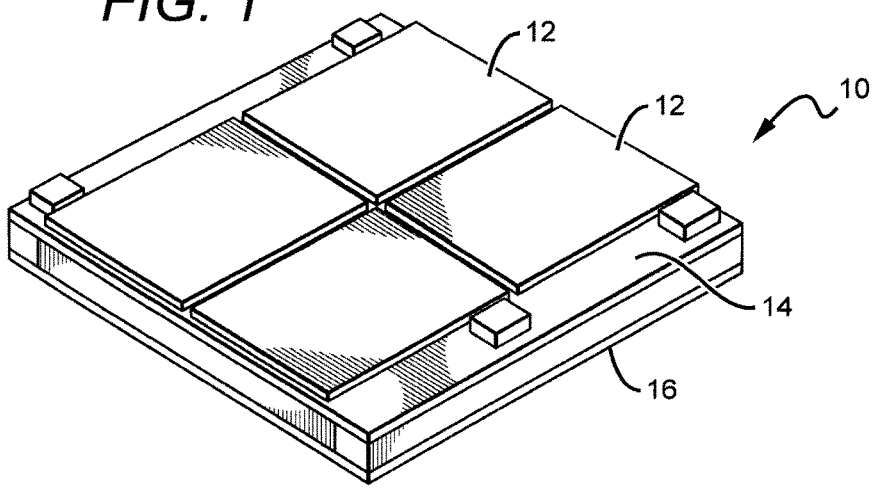
FIG. 1 is a perspective view of one embodiment of a memory module according to the present invention.

The present invention provides high density semiconductor memory modules arranged to replace conventional dual in-line memory modules (DIMM or DIMMs). Different embodiments of the present invention utilize three dimensional or 3D packaging technologies that can provide increased memory density while at the same time having a smaller footprint. This can be achieved using a number of different technologies such as very thin laminate boards, unique 3D interconnect solutions, high density surface mount technology (SMT) chip placement, and void-free overmold of module assemblies using semiconductor-grade transfer molding processes.

The different embodiments can be implemented with bare die or packaged elements and devices, with the bare die approach typically providing the highest density modules. Embodiment using packaged devices, such as integrated circuit (IC) implementations can provide simplified manufacturing and test requirements, and can be manufactured with reduced development time and expense. The different embodiments can be used in low, medium and high volume manufacturing processes.

The invention is described herein with reference to certain embodiments, but it is understood that the invention can be embodied in many different forms and should not be construed as limited to the embodiments set forth herein. In particular, the present invention is described below in regards to memory modules designed to interface with different host devices, but it is understood that it is applicable to many other host devices. The embodiments according to the present invention can be used with many different types and numbers of memory modules, and can also be used in conjunction with other electronic devices.

It is understood that when an element is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one element to another. It is understood that these terms are intended to encompass different orientations of the device in addition to the orientation depicted in the figures.

Although the terms first, second, etc., may be used herein to describe various elements, components, regions and/or sections, these elements, components, regions, and/or sections should not be limited by these terms. These terms are only used to distinguish one element, component, region, or section from another. Thus, unless expressly stated otherwise, a first element, component, region, or section discussed below could be termed a second element, component, region, or section without departing from the teachings of the present invention.

Embodiments of the invention are described herein with reference to cross-sectional view illustrations that are schematic illustrations. As such, the actual thickness of elements can be different, and variations from the shapes of the illustrations as a result, for example, of manufacturing techniques and/or tolerances are expected. Thus, the elements illustrated in the figures are schematic in nature and their shapes are not intended to illustrate the precise shape of a region of a device and are not intended to limit the scope of the invention.

Figure 2:
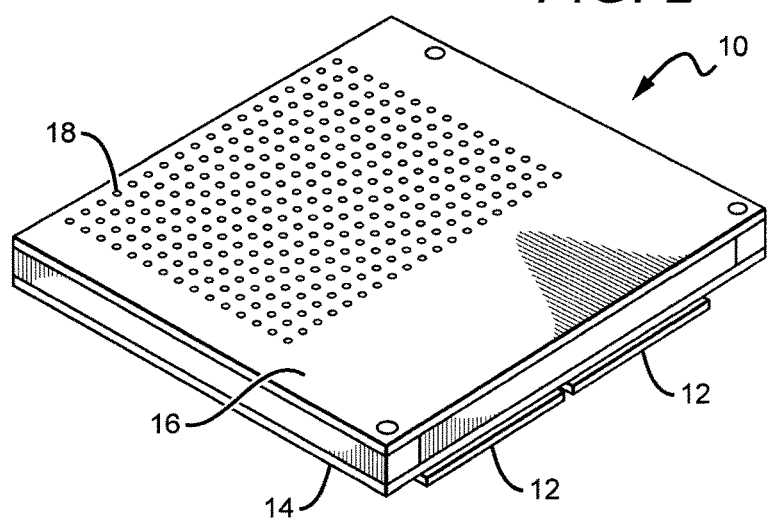
FIG. 2 is a perspective view of the flip-side of the memory module shown in FIG. 1.

FIGS. 1 and 2 show one embodiment of a high density memory module 10 according to the present invention that can be arranged in a 3-demensional module structure. That is, the module can be provided with more than one circuit board that are in a stacked arrangement, with memory modules and/or pin-outs occupying both sides of each of the boards. This can be contrasted with conventional memory modules having a single board having memory chips on one or both sides of the board.

Many different memory devices can be used in different memory modules according to the present invention, with some embodiments utilizing different types of dynamic random access memory (DDR3) modules. Referring now to FIG. 1, in the module 10 can comprise four DDR memory chips 12 mounted to the exposed surface of a first printed circuit board 14. Different mounting technologies can be used such as bare die, package surface mount or package lead mounting techniques. Referring now to FIG. 2, which is the flip side of the module 10 shown in FIG. 1, the exposed surface of a second printed circuit board 16 can comprise a pin-out 18 for pin mapping and connecting the module 10 to other devices. In some embodiments, the pin-out 18 is arranged to be compatible with a field programmable gate array (FPGA), cut it is understood that it can be arranged to be compatible with other devices. As described in further detail below, other embodiments can have additional devices, such as memory modules, between the first and second circuit boards 14, 16 to provide additional features and/or memory. In still other embodiments, devices can be included around the module pin-out 18 on the exposed surface of the second board 16.

The different module embodiments according to the present invention can have many different shapes and sizes. The module 10 shown in FIGS. 1 and 2 can have many different sizes, and as shown is approximately 24 by 24 by 4.5 mm. The module 10 can also have the same memory capacity to replace much larger conventional DIMM modules, such as those with dimensions of 133×30×4 mm. Many different memory chips can be used in different embodiments according to the present invention, with some embodiments using commercially available memory chips.

Providing a memory module that is pin-mapped to devices such as FPGAs, the module can be attached to the opposite side of the FPGA printed circuit board (PCB). This can eliminate the need for most or all PCB routing, with the memory module attached by through-hole vias. This arrangement can result in reduced design time and layer count for the motherboard PCB.

This arrangement can also result in improved signal integrity by having dramatically reduced trace length between the host device (FPGA, µP or ASIC) and DDR3 memory devices. This can be done while still controlling impedance and matching route lengths. Another potential advantage is improved air flow. The modules according to the present invention can have much lower "z" height than standard DIMM modules, which can result in opening of air channels to improved thermal management. In addition, the different embodiments can also reduce system power requirements. VTT at the address and control lines can be reduced or eliminated, with a corresponding turn off of ODT on memory and turn off of DCI on the FPGA. The arrangement can result in minimizing FPGA drive strength. The different modules according to the present invention are capable of operating at many different speeds, with one embodiment operating at approximately 1333 MHz.

Figure 3:
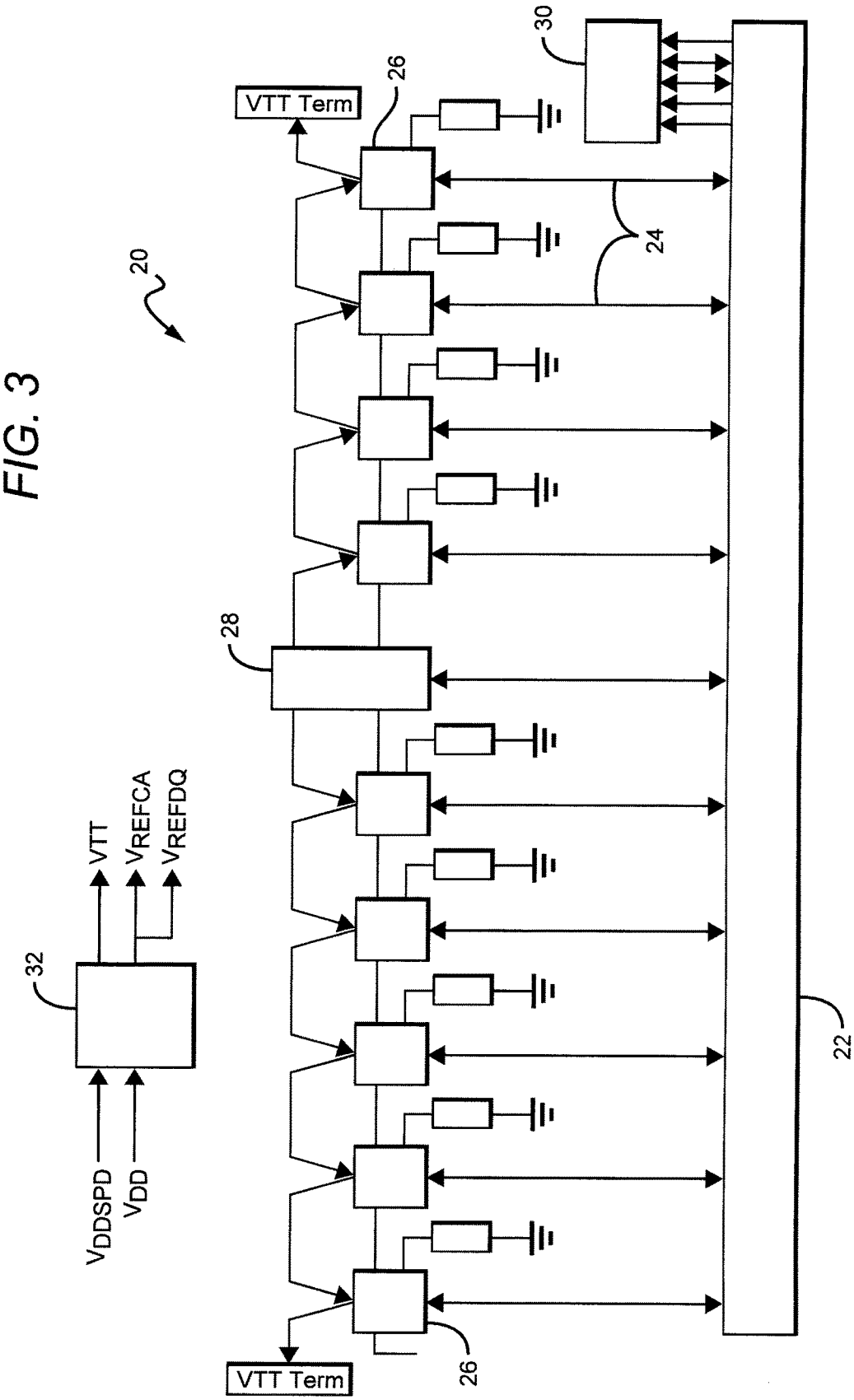
FIG. 3 is a schematic for one embodiment of a memory module according to the present invention coupled to a FPGA.

FIG. 3 shows a schematic of one embodiment of a memory module 20 according to the present invention coupled to FPGA 22 through its pin-out 24. This arrangement is schematically equivalent to a conventional DDR3 DIMM module, but is pinned-out to directly couple to a large FPGA as described above. Each of the memory modules 26 is coupled to the FPGA 22 through the pin-out 24, with the module 10 also comprising additional devices and circuitry. Many different additional devices can be used, with the embodiment shown having registered buffer with address parity test module 28, such as the SN74SSQ32882 commercially available from Texas Instruments, Inc. The module 20 can also comprise a memory module temperature sensor 30, such as the STTS424EO2, commercially available from STMicrolectonics, Inc. The module 20 can also comprise an optional on module VTT and Vref generator that can include a termination regulator 32, such as the TPS51200 termination regulator, commercially available from Texas Instruments, Inc.

FIGS. 4a-4e show different views of one embodiment of a module 50 according to the present invention. Like the embodiment above, it has four memory modules 52 on the exposed surface 56 of a first (top) board 54 and four additional memory chips 52 that can be mounted to the opposite side 58 of the first board 54. A second board 60 is included, with the first and second boards 54, 60 in a stacked arrangement. The exposed (or bottom) surface 62 of the second board 60 comprises a pin-out, and as mentioned above the pin-out 64 that, as described above, can be compatible with many different devices, such as an FPGA, μP or ASIC. The modules according to the present invention provide flexibility to allow the pin-out to directly couple to the memory pins of these devices. That is, different embodiments can have pin-outs arranged in different ways depending on the type of host device it is to be coupled to.

Figure 4A:
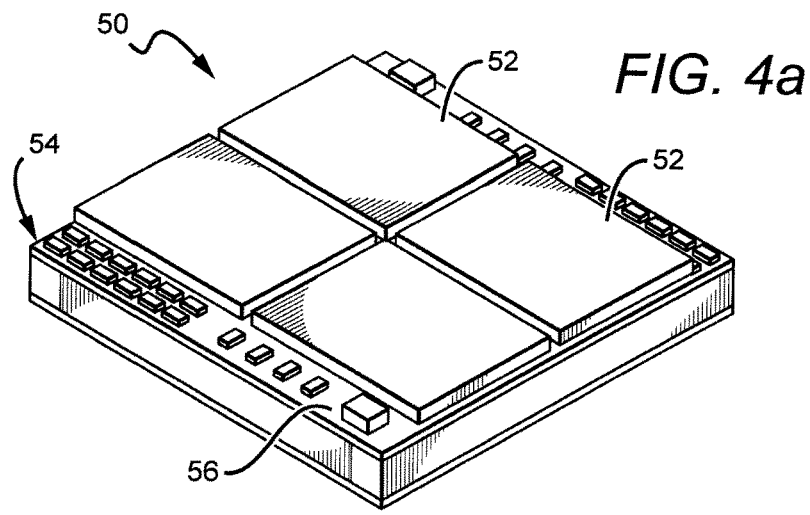
FIG. 4a is a top perspective view of one embodiment of a memory module according to the present invention.
Figure 4B:
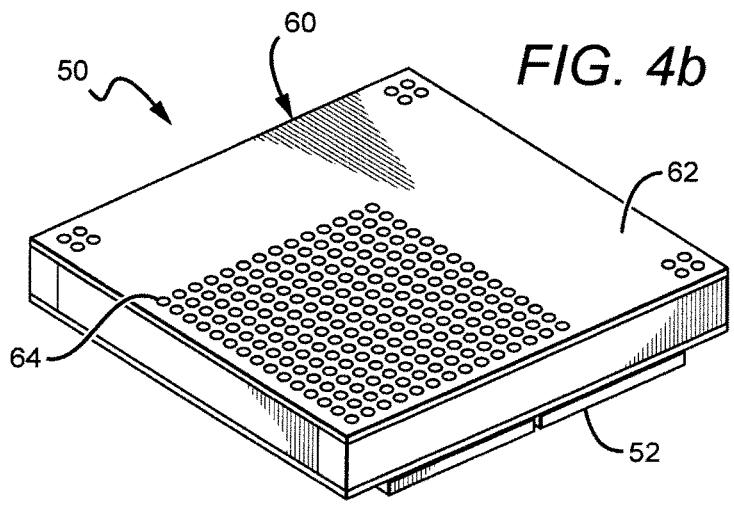
Figure 4C:
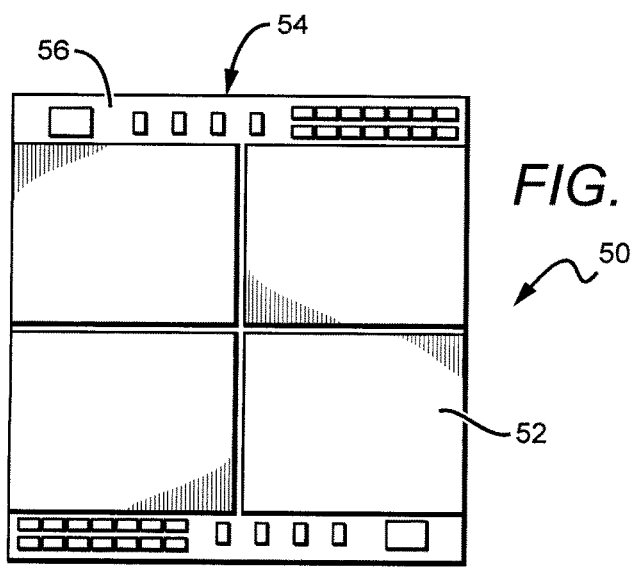
Figure 4D:
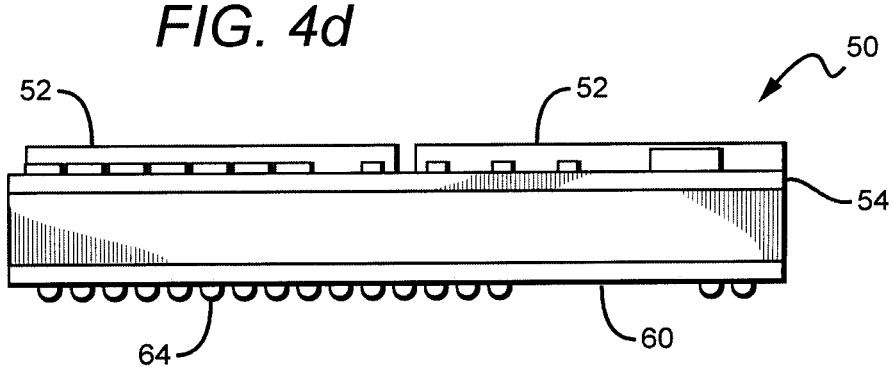
Figure 4E:
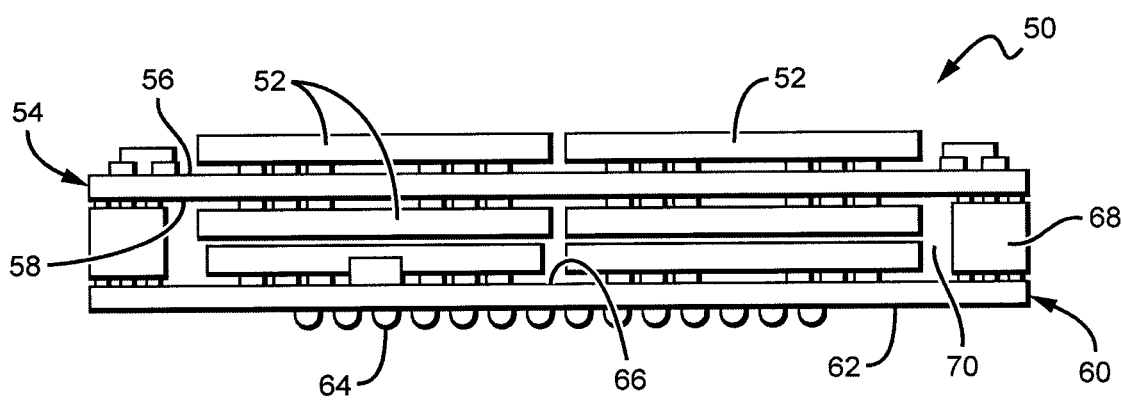
Figure 4F:
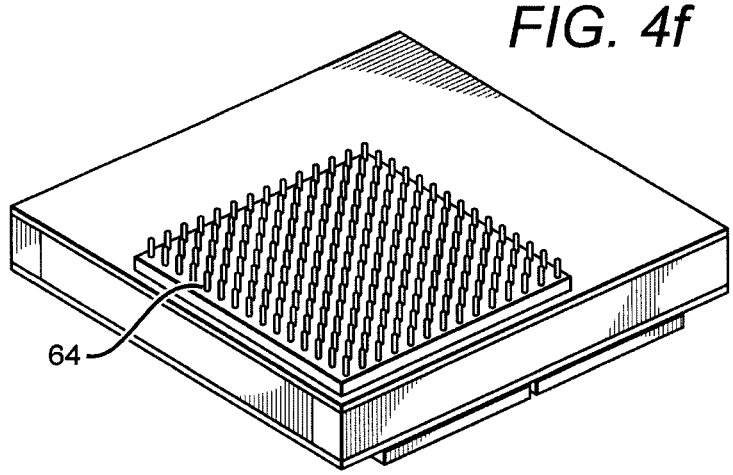
FIG. 4f is a bottom perspective view of the a memory module similar to the one shown in FIG. 4a, with an alternative pin-out.

Different types of on pin-outs can be used with the different modules, with some embodiments utilizing a conventional ball grid array (BGA) pin-outs 64, as best shown in FIGS. 4b and 4e. Other embodiments can use conventional HiLo interconnects 64, as best shown in the alternative pin-out arrangement shown in FIG. 4f which allows for modules to be arranged over and above devices on that hold the PCB. For instance, the memory modules may need to be placed over and above one or more decoupling capacitors on the PCB. The HiLo pin-out can provide an additional 3 mm of spacing to allow for this arrangement. The pin-out in different embodiments can be in different locations on the second board 60, such as near the center of the board, off-center, or in one of the corners of the board.

As discussed above, the space between the first and second boards 54, 60 can comprise additional devices, and in the embodiment shown, the bottom surface of the top board had four memory devices 52. The top surface 66 of the second board 60 can also hold different devices, and in the embodiment shown holds one memory device 52. It can also hold a variety of other devices such as those described above with reference to FIG. 3. The top and bottom boards 54, 60 are spaced apart the desired distance by spacers 68, which can further comprise contacts or interconnects to conduct electrical signals between the top and bottom boards 54, 60. Different thermal solutions can also be added to the space between the boards if necessary, and/or the space 70 between the boards 54, 60 can be filled using a void fee overmold or underfill process. This can fill the space between the boards and space between the devices held on the boards.

Figure 5:
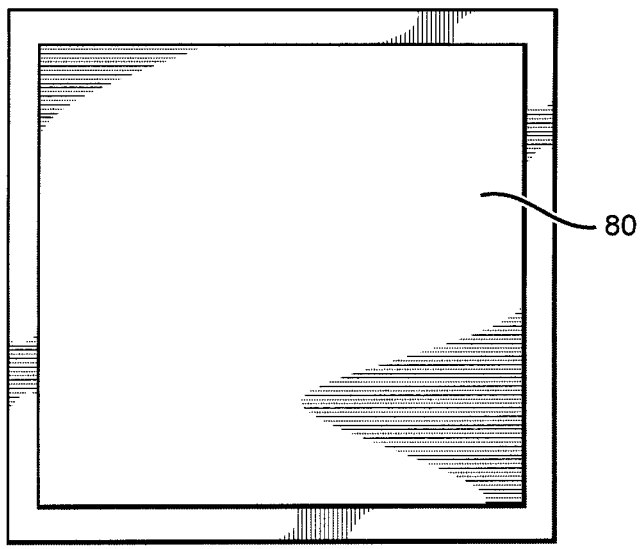
FIG. 5 shows a plan view of an FPGA or ASIC using memory modules according to the present invention.
Figure 6:
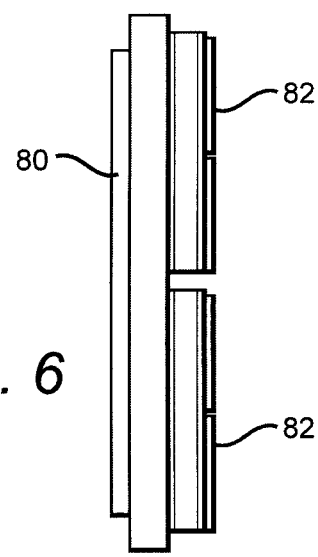
FIG. 6 is a side view of the FPGA or ASIC in FIG. 5 with memory modules according to the present invention mounted on the opposite side of the FPGA or ASIC.
Figure 7:
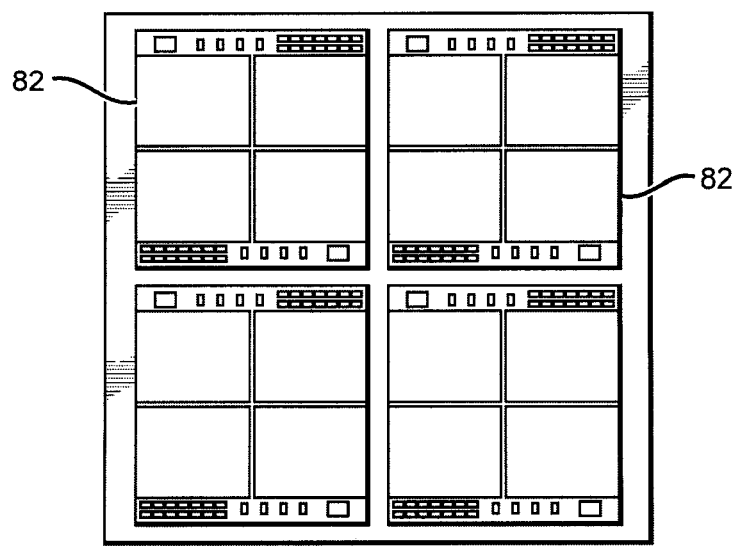
FIG. 7 is a plan view of the memory modules according to the present invention mounted opposite the FPGA or ASIC.

FIGS. 5 through 7 show one embodiment of a FPGA 80 coupled to a plurality of memory modules 82 according to the present invention. The embodiment shown utilizes four memory modules 82 similar to those described above, with the FPGA 80 mounted to one side of a PCB and the memory modules 82 mounted to the opposite side. Each of the memory modules 82 is directly pin-mapped to the memory module pins in a quadrant of the FPGA 80. The four memory modules 82 can provide different memory capacity, with the embodiment shown providing 16 GB. As mentioned above, the memory modules 82 can utilize many different memory devices, with the embodiment shown utilizing DDR3 devices.

Utilizing the memory module arrangements according to the present invention, a memory device routing can be eliminated from the system (i.e. FPGA) board. Instead, vias through the motherboard connect the FPGA to the memory modules. This can result in a significant reduction in the number of layers necessary for the system PCB, with some experiencing a reduction of more than 10 layers compared to similar system PCB using convention memory modules. In some embodiments, up to 14 layers or more can be eliminated.

Figure 8:
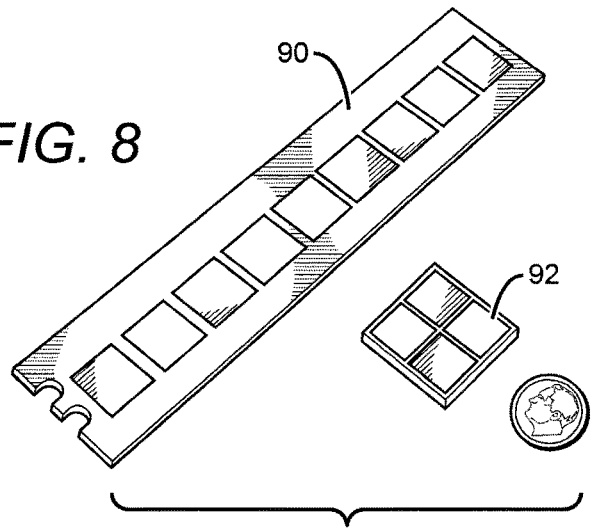
FIG. 8 shows a comparison of conventional memory modules and modules according to the present invention.

FIGS. 8 and 9 illustrate the size and footprint reductions provided by memory modules according to the present invention. FIG. 8 shows one conventional DIMM module 90 next to a memory module 92 according to the present invention having the same memory capacity. FIG. 9 shows two conventional DIMM modules 100 next to a dual memory module 102 according to the present invention having the same memory capacity. It is understood that other memory module arrangements can result in different size and footprint reductions depending on the arrangements of the module components and devices.

FIG. 10 shows one embodiment of a device 110 having conventional DIMM modules 112, compared to the same device 114 utilizing memory modules 116 according to the present invention. The memory modules 116 can reduce the memory footprint by over 50% (e.g. 133×30×4 mm for DIMM, compared to 24×24×6 mm for modules according to the present invention). The modules 116 can also provide for improved airflow, improved signal integrity, and lower cost and simplicity for host printed circuit board. FIG. 11 shows still another device 120 having DIMM modules 122 that can be replaced by smaller memory modules 124 according to the present invention.

The module arrangements discussed herein can utilize many different memory devices beyond DDR3, including but not limited to SRAM, RLDRAM, Flash, LPDDR, Hybrid memory, and/or any combination of the above. Different logic and memory combinations can be used beyond those described above, including but not limited to processor in memory (PiM) and intelligent storage/SSD. In each case these can be utilized as described above to provide the advantages of the present invention. They can be utilized with bare die devices to maximize density, or with packaged devices for simplicity. Increase system performance by optimizing signal integrity. The arrangements can minimize power consumption while reducing complexity of the motherboard. This in turn can reduce or minimize system cost.

As mentioned above, different memory module embodiments can provide different memory capacities, with one embodiment above utilizing DDR3 memory devices having 4 GB capacity. This allows for up to 16 GB of memory using current technology, while reducing PCB footprint. This is only one example of memory capacity for modules according to the present invention, and it is understood that different modules can have more or less capacity. It is also understood that the memory capacity for memory modules according to the present invention may increase with technology advances in memory devices. Additional features can result in improvements in signal integrity to achieve higher speeds, such as in the range of 1600 to 2133 MT/s or higher. This is only one example of operating speed for modules according to the present invention and it is understood that different modules operate at different speeds. It is also understood that the operating speed for memory modules according to the present invention may increase with technology advances in memory module devices. The system power consumption can be further reduced by the management of slew rates, management of drive strengths, reduction in trace lengths, optimized buffering and removal of termination (ODT, VTT, DCI, etc.)

Different embodiments can also utilize 2.5D packaging (multi-die on silicon substrate) to further increase memory bandwidth. This can include but is not limited to different flash-based processor in memory (PiM) devices, such as 20 GByte/s flash based PiM. Others can include 150 GByte/s SRAM PiM.

Although the present invention has been described in detail with reference to certain preferred configurations thereof, other versions are possible. Therefore, the spirit and scope of the invention should not be limited to the versions described above.

We claim:

1. A memory module, comprising:
   a first printed circuit board having a first side opposite a second side and a first edge opposite a second edge;
   a second printed circuit board having a first side opposite a second side and a first edge opposite a second edge, wherein said first edge and second edge of said second printed circuit board align with said first edge and said second edge of said first printed circuit board;
   a plurality of memory devices arranged exclusively on said first side and said second side of said first printed circuit board and on said first side of said second printed circuit board;
   a plurality of spacers electrically connecting said first printed circuit board to said second printed circuit board, wherein said plurality of spacers have first edges and second edges that extend to said first edge or said second edge of said first printed circuit board and said second printed circuit board, and wherein said plurality of spacers creates a space between said first printed circuit board and said second printed circuit board and a space between said plurality of memory devices arranged on said second side of said first printed circuit board and arranged on said first side of said second printed circuit board; and
   a pin-out arranged on said second side of said second printed circuit board between said plurality of spacers, wherein said pin-out is configured to attach to a host device.

2. The memory module of claim 1, wherein said pin-out comprises a ball grid array.

3. The memory module of claim 1, wherein said pin-out comprises a HiLo array.

4. The memory module of claim 1, wherein said pin-out matches signal route lengths between said plurality of memory devices and said host device.

5. The memory module of claim 1, further comprising an overmold coupled between said first printed circuit board and said second printed circuit board, wherein said overmold at least partially fills said space between said first printed circuit board and said second printed circuit board.

6. The memory module of claim 1, wherein said plurality of memory devices are field programmable gate arrays (FPGA).

7. The memory module of claim 1, wherein said plurality of memory devices are dynamic random access memory (DRAM) devices.

* * * * *